Sept. 5, 1967 F. V. FRICKER, JR 3,340,437

COMPONENT ASSEMBLY WITH FLEXIBLE CHANNEL SHAPED PRINTED CIRCUIT BOARD

Filed March 22, 1965

INVENTOR.
FRANK V. FRICKER JR.

BY Arthur H. Swanson

ATTORNEY.

United States Patent Office 3,340,437
Patented Sept. 5, 1967

3,340,437
COMPONENT ASSEMBLY WITH FLEXIBLE CHANNEL SHAPED PRINTED CIRCUIT BOARD
Frank V. Fricker, Jr., Roslyn, Pa., assignor to Honeywell Inc., a corporation of Delaware
Filed Mar. 22, 1965, Ser. No. 441,418
2 Claims. (Cl. 317—101)

One of the objects of the present invention is to disclose a unique space-saving module for mounting electrical components on a printed circuit board.

More specifically, the present invention discloses a module of the aforementioned type which will enable a series of diodes, resistors, wire junctions and other similar electrical components to be electrically interconnected in a sturdy manner on a printed circuit board.

It is still another object of the present invention to provide a module of the aforementioned type with a unitary casing component which has a plurality of apertures therein adapted to receive and to retain any one or any combination of the aforementioned electrical components in close, spaced-apart, encased relationship with one another and at a selective distance from the printed circuit board to allow heat that is dissipated from these components to be readily dissipated to the atmosphere.

It is still another object of the present invention to provide a substantially rectangular-shaped, resilient, bendable film with any one of a number of desired etched-out, copper, printed circuit electrically-clad connections thereon as a second component part of the aforementioned module.

It is still another object of the invention to provide the aforementioned casing component with parallel slots therein to accommodate the insertion of the longitudinal edge of any one of the previously-mentioned different types of printed circuits in a substantially semi-circular position therein so that one of the two oppositely-extending conductors, which protrudes from each of the components through one end of the casing, can be readily electrically interconnected in any one of a number of different ways.

It is another object of the present invention to provide each successive conductor that extends from the ends of each of these electrical components with progressively shorter lengths of wire to facilitate ease of insertion when being assembled at these ends to a printed circuit board.

It is another object of the invention to provide a unique, four-component module of the aforementioned type that will facilitate rapid insertion of one or more diodes, resistors, wire connections or other similar electrical components as an integral part of an electrical circuit assembly and to further provide a rapid means of disassembling any selected one or all of these electrical components when they need to be replaced.

A better understanding of the present invention may be had from the following detailed description when read in connection with the accompanying drawings in which.

Figure 1:
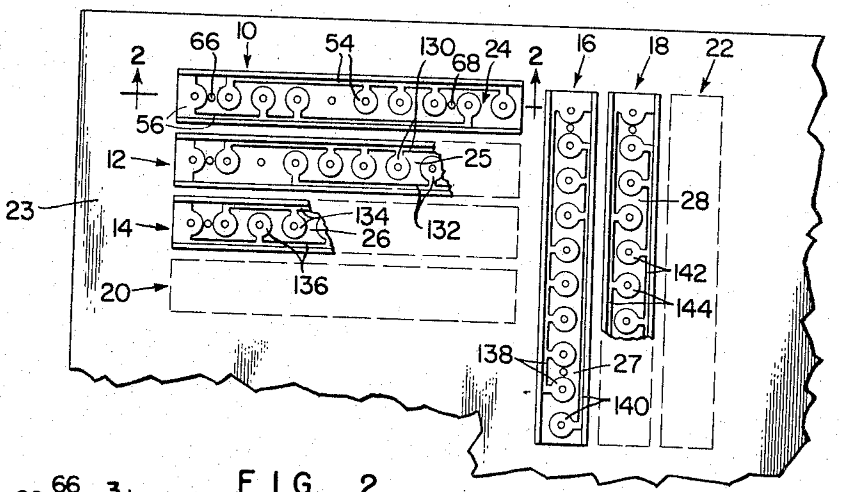
FIGURE 1 shows how a plurality of the aforementioned modules can be completely mounted on a printed circuit board.

Each of the series of the aforementioned modules is identified in FIGURE 1 of the drawing by reference numeral 10, 12, 14, 16, 18, 20 and 22. By way of example, module 10–18 is shown having a common rigid printed circuit board 23 for its base and a separate, different, electrically-connected, bowed, rectangular-shaped, bendable, insulated, plastic printed circuit plate 24, 25, 26, 27, or 28 for its top portion.

Figures 2, 3, 4:
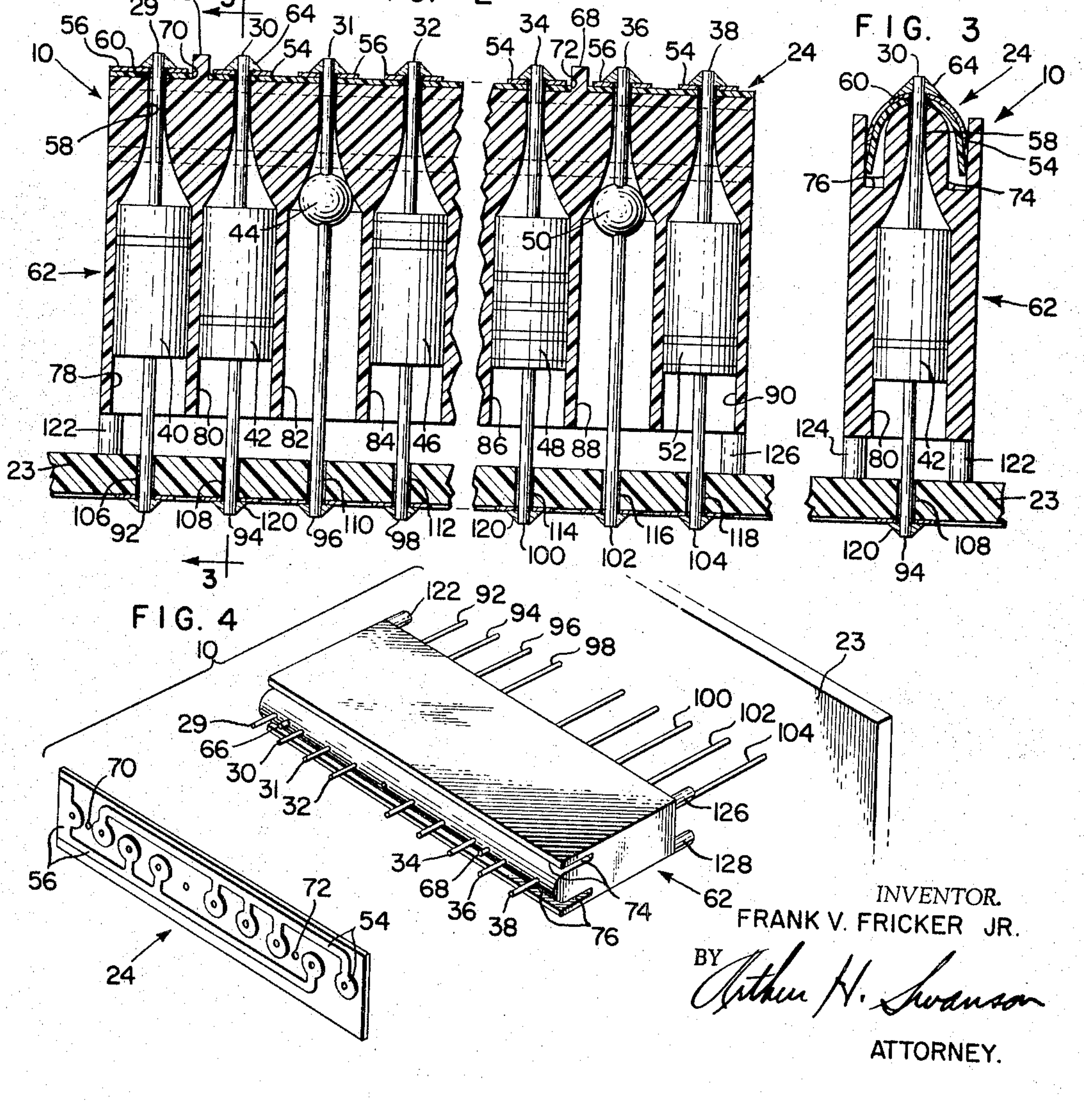
FIGURE 2 shows a view taken along the section line 2—2 of FIGURE 1 showing a vertical cross-section of one of the aforementioned modules.
FIGURE 3 is a sectional view taken along the section line 3—3 of FIGURE 2.
FIGURE 4 is an exploded view to show how the various parts of the module can be readily assembled.

The bendable printed circuit plate 24, shown in FIGURES 1, 2 and 3 is employed as a second portion of the module 10. The board 24 is made of a suitable resilient copper-clad plastic material, for example a plastic material tradenamed Teflon. Portions of the copper on this board 24 that are not required to make the desired conductor connections between the extension leads 29–38, that extend upwardly from the diodes 40, 42, wire connection 44, first resistor 46, a second different resistor 48, a second wire connection 50 and a third resistor 52, are removed by a well-known process which is commonly referred to as etching. Each of the remaining copper conductor connections 54, 56 is electrically interconnected to its associated electrical lead 29, 30, 31, 32, 34, 36 or 38 by first passing these leads through the aligned apertures, for example 58, 60 formed in the top of the unitary casing component 62, and joining them (as shown) to these copper connections 54, 56 by suitable soldering material 64.

The casing component 62 is preferably made of a glass-filled nylon material that will withstand temperatures encountered in the melting of solder.

The unitary casing 62 is provided with two spaced-apart pins 66, 68 protruding therefrom. The bendable printed circuit plate 24 is provided with two spaced-apart circular wall portions 70, 72 forming apertures therein which are purposely spaced at the same unequal distances from their opposite ends of the resilient board 24 as the associated pins 66, 68 with which they are brought into surrounding engagement in order to make sure the printed circuit is assembled in its proper condition.

If the apertures 70, 72 of the plate 24 are not correctly positioned, the plate 24 cannot be brought into engagement with the longitudinal slotted portions 74, 76, as is best shown in FIGURES 3 and 4.

It should be understood that the other modules 12–18 are similar in construction to the module 10, just described, in that they employ the same type of unitary casing component 62 having bored-out apertured wall portions which are similar to the bored-out wall portions 78, 80, 82, 84, 86, 88 and 90, shown in FIGURE 2 for module 10.

It should also be understood that the conductors which extend from the lower portion of the modules 12–18 pass through apertures in a printed circuit board in the same manner as the conductors 92, 94, 96, 98, 100, 102 and 104 pass through the apertured wall portions 106–118 in the printed circuit board 23 of the module 10 and each is connected by a soldering material 120, as shown in FIGURES 2 and 3.

The lower four corners of each of the modules 12–18 are mounted in spaced relation to an associated printed circuit board by means of legs in the same manner in which similar legs 122, 124, 126, 128 are employed for the module 10, shown in FIGURES 2–4.

Each of the modules 12–18 differs in construction from the conductor connections 54, 56 shown for the module 10 in the manner in which its associated pairs of copper conductor connections 130, 132; 134, 136; 138, 140; 142, 144 electrically interconnect any one or more of the many same or different type of diodes, resistors or electrical wire connection components that are employed with these modules 12–18.

From the aforementioned description, it can be seen that a unique, sturdy, heat-dissipating, space-saving module having a unitary casing has been disclosed that affords ease of assembly and disassembly of any selected one or all of the number of diodes, resistors, wire junctions or other similar electrical components in a circuit and can further beneficially employ any one of a number of different types of bendable printed circuits to electrically connect these components in any one of a variety of ways.

What is claimed is:

1. In a modular structure, a substantially rigid first printed circuit board, a casing constructed of a non-conductive material, one end of the casing being mounted on the board and its opposite end having recessed portions therein forming outer wall parts thereof, a unitary resilient arch shaped plate located immediately adjacent the casing having edge portions constructed of insulating material in spring-biased engagement with the recessed portions, a printed circuit formed in another portion of the resilient plate that extends between said edge portion, the printed circuit board, casing and the resilient plate containing the printed circuit each having at least two aligned passageways therein to accommodate the insertion of separate electrical components in the casing and the conductors that extend from the opposite ends of the electrical components into direct electrical electrical contact with spaced apart conducting circuit portions of the printed circuit board and into direct electrical contact with spaced apart conducting circuit portions of the printed circuit formed in the resilient plate for transmitting a current back and forth between the two printed circuits.

2. In a modular structure a substantially rigid first printed circuit board, a casing of translucent insulating material, one end of the casing being mounted on the board its opposite end having recessed portions therein forming an outer wall part thereof, a unitary bowed-shaped resilient plate located immediately adjacent the casing having edge portions constructed of an insulating material in engagement with the recessed portions, a printed circuit formed in another portion of the resilient plate the printed circuit board, casing and the resilient plate containing the printed circuit each having a plurality of aligned passageways therein to accommodate the insertion of separate electrical components in the casing and the conductors that extend from the opposite ends of the electrical components into direct electrical contact with spaced apart conducting circuit portions of the printed circuit board and into direct electrical contact with different conductive parts of the conducting circuit portions of the printed circuit formed in the resilient plate for transmitting a current back and forth between the two printed circuits.

References Cited

UNITED STATES PATENTS

| | | | |
|---|---|---|---|
| 3,077,658 | 2/1963 | Wharton | 317—101 |
| 3,089,062 | 5/1963 | Schulz | 317—101 |
| 3,098,950 | 7/1963 | Geshner | 317—101 |
| 3,134,930 | 5/1964 | Wright | 317—101 |

OTHER REFERENCES

IBM Technical Disclosure Bulletin, vol. 7, No. 3, August 1964, page 182.

ROBERT K. SCHAEFER, *Primary Examiner.*

W. C. GARVERT, J. R. SCOTT, *Assistant Examiners.*